(12) United States Patent
Liaw

(10) Patent No.: US 6,914,338 B1
(45) Date of Patent: Jul. 5, 2005

(54) MEMORY CELL HAVING CONDUCTIVE SILL

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/819,004

(22) Filed: Apr. 6, 2004

(51) Int. Cl.[7] ............................................. H01L 27/11
(52) U.S. Cl. .............................. 257/903; 257/E27.098
(58) Field of Search ......................... 257/903, E27.098

(56) References Cited

U.S. PATENT DOCUMENTS

| 5,593,922 | A | 1/1997 | Liaw et al. |
|---|---|---|---|
| 5,780,331 | A | 7/1998 | Liaw et al. |
| 5,827,764 | A | 10/1998 | Liaw et al. |
| 5,843,815 | A | 12/1998 | Liaw |
| 5,866,449 | A | 2/1999 | Liaw et al. |
| 5,930,633 | A | 7/1999 | Liaw |
| 5,955,768 | A | 9/1999 | Liaw et al. |
| 5,972,759 | A | 10/1999 | Liaw |
| 6,013,547 | A | 1/2000 | Liaw |
| 6,121,684 | A | 9/2000 | Liaw |
| 6,239,458 | B1 | 5/2001 | Liaw et al. |
| 6,380,024 | B1 | 4/2002 | Liaw |
| 6,417,032 | B1 | 7/2002 | Liaw |
| 6,690,053 | B2 * | 2/2004 | Amo et al. ................. 257/306 |
| 2003/0012048 | A1 | 1/2003 | Chappell et al. |
| 2003/0039146 | A1 | 2/2003 | Choi |
| 2003/0042528 | A1 | 3/2003 | Forbes |
| 2003/0043657 | A1 | 3/2003 | Shau |

* cited by examiner

Primary Examiner—David Nelms
Assistant Examiner—Tu-Tu Ho
(74) Attorney, Agent, or Firm—Haynes and Boone, LLP

(57) ABSTRACT

A memory cell comprises a plurality of transistors. Each of the transistors include source/drain regions located in a substrate and a gate electrode located over the substrate between associated source/drain regions. The memory cell also includes at least one conductive sill contacting a source/drain region of a first one of the plurality of transistors and a gate electrode of a second one of the plurality of transistors.

24 Claims, 4 Drawing Sheets

MEMORY CELL HAVING CONDUCTIVE SILL

BACKGROUND

The present invention relates generally to memory cells and, more specifically, to a memory cell having a conductive sill.

In deep sub-micron technology, static-random-access-memory (SRAM) is a very popular storage unit for high-speed, low-power communication devices and other consumer products. As SRAM cells have experienced widespread use, manufacturing costs, thermal stability and power reduction have become important issues. Myriad new procedures and structures have been employed to address these issues.

For example, the "butted" contact (also referred to as a butt contact, a coupled contact or a shared contact) is a widely accepted and utilized process that is employed in memory cell designs to connect a transistor gate and a transistor source/drain region. The butted contact can be generally employed to increase the device density by reducing the amount of area needed for contact purposes. However, the butted contact requires simultaneously etching a standard or square contact and a butted contact, which is often rectangular in shape. This can be very difficult for an etch process to accomplish due to the different contact sizes and shapes and fluctuation of the thicknesses of etch stop layers employed to form the contacts in various polysilicon layers. For example, simultaneously etching two different-shaped contacts can result in a higher junction leakage, possibly attributable to over-etching of an etch stop layer proximate one of the contacts. Current leakage may also occur between a butted contact and an underlying doped well, possibly due to similarities in composition of the doped well and surrounding features, such that the selectivity of an etchant chemistry may not be fully utilized.

Consequently, existing memory devices incorporate additional connectors or interconnects formed in one or more additional conductive layers which, in turn, require additional dielectric layers. Obviously, it is desirable to minimize the number of layers required to fabricate any microelectronic device, because each additional layer increases manufacturing costs, decreases reliability and product yield, and renders fabrication processes more time consuming and complex. Moreover, the additional connectors and vias required for their interconnection increases the resistance between features interconnected by the additional connectors and vias.

SRAM and other memory cells are also vulnerable to soft error, usually characterized by a quantitative soft error rate (SER). SER is a failure mode that can be caused by ionizing radiation originating from the packaging material or other sources, and can ultimately change the state of a transistor. The significance of SER increases as device geometries continue to shrink.

Accordingly, what is needed in the art is a memory cell and method of manufacture thereof that addresses the above-discussed issues of the prior art.

SUMMARY

The present disclosure provides a memory cell comprising a plurality of transistors, wherein each of the transistors includes source/drain regions located in a substrate and a gate electrode located over the substrate between associated source/drain regions. The memory cell array also includes at least one conductive sill contacting a source/drain region of a first one of the plurality of transistors and a gate electrode of a second one of the plurality of transistors.

The present disclosure also introduces an integrated circuit that, in one embodiment, includes a substrate having first and second regions opposing an isolation structure, wherein the first and second regions include respective first and second doped wells. The integrated circuit also includes first and second transistors. The first transistor includes a gate electrode spanning the isolation structure and extending at least partially over the first doped well and the second substrate region. The second transistor includes a source/drain region in the second doped well. The integrated circuit also includes a conductive sill contacting a portion of the source/drain region of the second transistor and interposing the gate electrode of the first transistor and a portion of the second region.

A method of manufacturing a memory device is also provided by the present disclosure. In one embodiment, the method includes forming a plurality of transistors over a substrate, including forming a plurality of source/drain regions in the substrate and forming a plurality of gate electrodes over the substrate and between associated ones of the plurality of source/drain regions. The method also includes forming at least one conductive sill coupling at least of one of the plurality of source/drain regions and at least one of the plurality of gate electrodes.

The foregoing has outlined features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
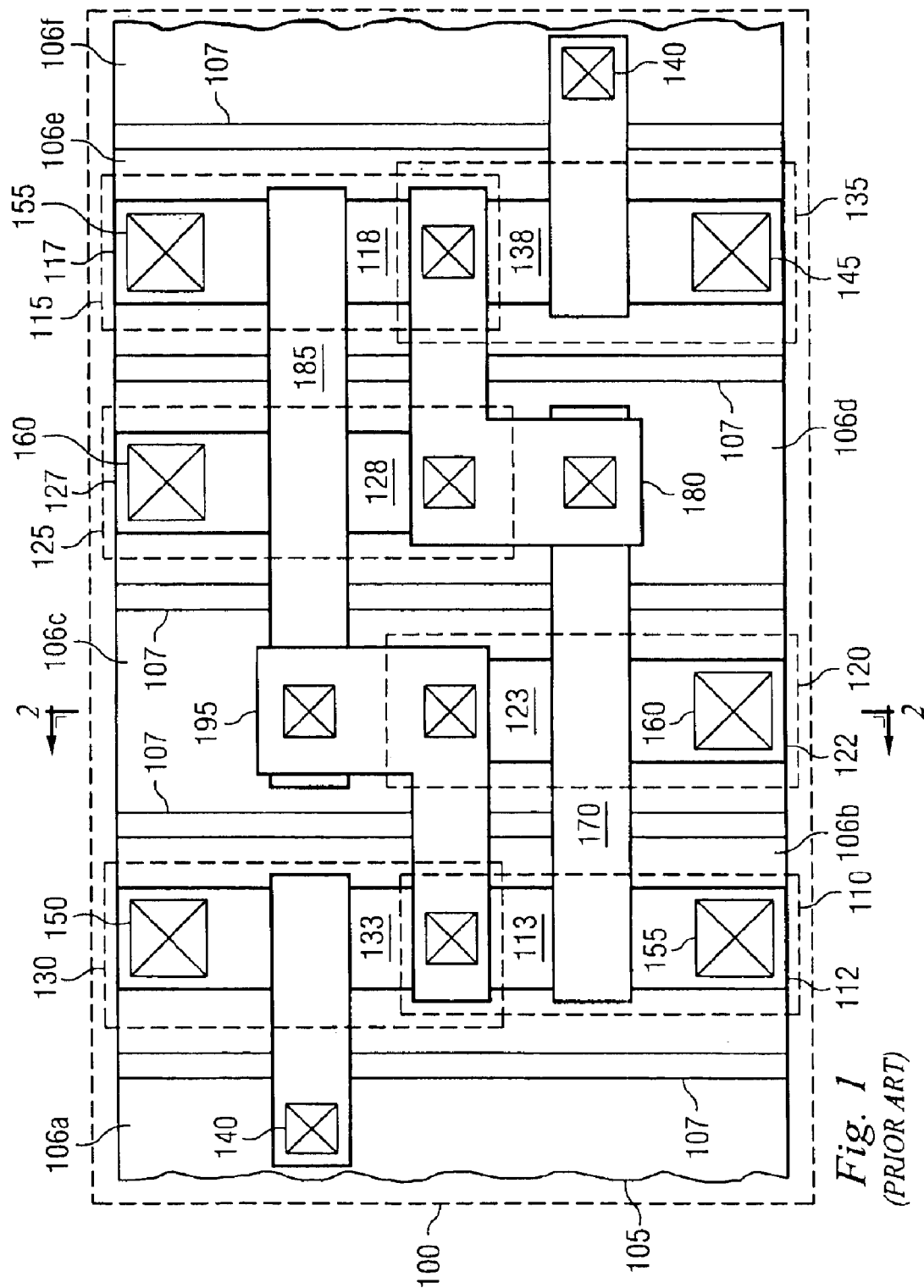
FIG. 1 illustrates a layout view of a conventional memory cell.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a layout view of a conventional memory cell 100. The memory cell 100 is formed over a substrate 105 having regions 106a–f defined by isolation structures 107. The memory cell 100 includes first and second pull-down transistors 110, 115, first and second pull-up transistors 120, 125 and first and second pass-gate transistors 130, 135. The memory cell 100 also includes word-line contacts 140, a bit-line contact 145, a bit-bar-line contact 150, $V_{ss}$ contacts 155 and $V_{cc}$ contacts 160.

A first shared gate 170 spans a p-type doped well 112 of the first pull-down transistor 110 and an n-type doped well 122 of the first pull-up transistor 120 and extends over an isolation structure 107 into the transistor region 106d. One of many vias 175 couples the first shared gate 170 to a first connector 180. The first connector 180 is coupled by vias 175 to the drain 128 of the second pull-up transistor 125, to the source 118 of the second pull-down transistor 115 and to the source 138 of the second pass-gate transistor 135. A second shared gate 185 spans a p-type doped well 117 of the second pull-down transistor 115 and an n-type doped well 127 of the second pull-up transistor 125 and extends over an isolation structure 107 into the transistor region 106c. A via 175 couples the second shared gate 185 to a second connector 195. The second connector 195 is coupled by several vias 175 to the drain 123 of the first pull-up transistor 120, to the source 113 of the first pull-down transistor 110 and to the source 133 of the first pass-gate transistor 130.

Figure 2:
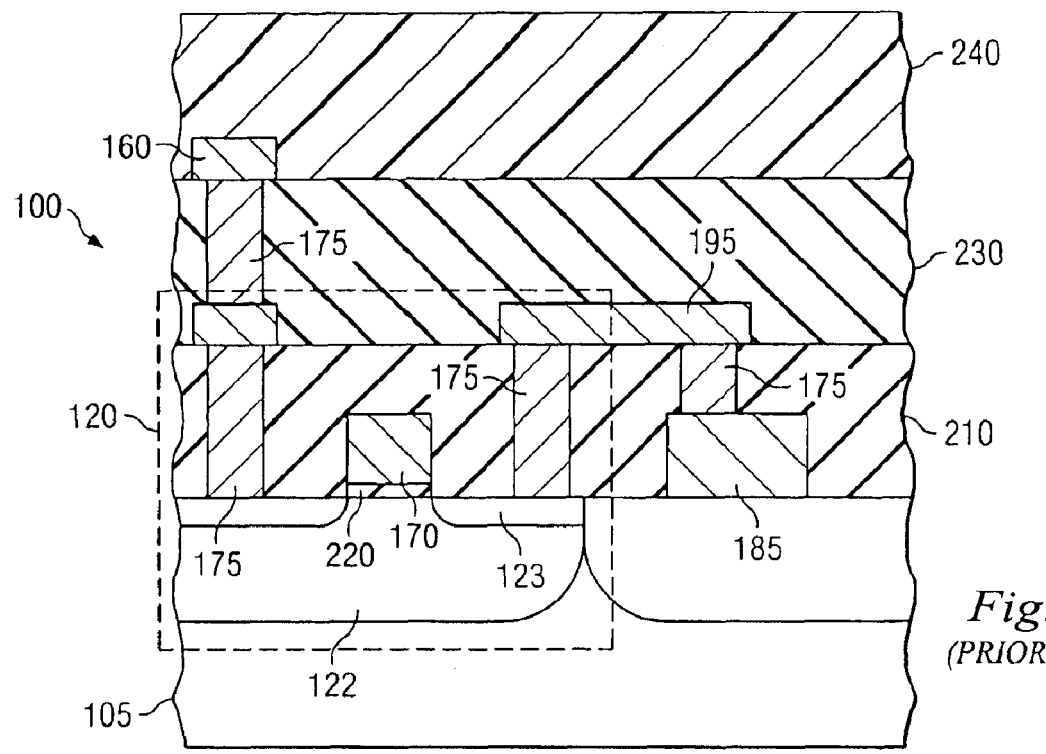
FIG. 2 illustrates a sectional view of the memory cell shown in FIG. 1.

Referring to FIG. 2, illustrated is a sectional view of the memory cell 100 shown in FIG. 1 in a subsequent stage of manufacture. A first dielectric layer 210 is formed over the substrate 105, including over the first and second shared gates 170, 185. The second connector 195 is formed over the first dielectric layer 210 and is coupled to the drain 123 of the first pullup transistor 120 and the second shared gate 185 by vias 175. As discussed above, it is desirable to reduce the number of conductive and dielectric layers required to fabricate the memory cell 100.

The first pull-up transistor 120 also includes a gate oxide 220 formed between the first shared gate 170 and the substrate 105, adjacent the drain 123. One or more dielectric layers 230 may be formed over the first dielectric layer 210 and the second connector 195. The $V_{cc}$ contacts 160 may then be formed over the additional dielectric layer(s) 230 and interconnected with the underlying devices by vias 175. A packaging layer 240 is typically formed over the dielectric layers 230 and the $V_{cc}$ contacts 160. As discussed above, the packaging layer 240 can be a source of radiation that increases the soft error rate of the memory cell 100.

Figure 3:
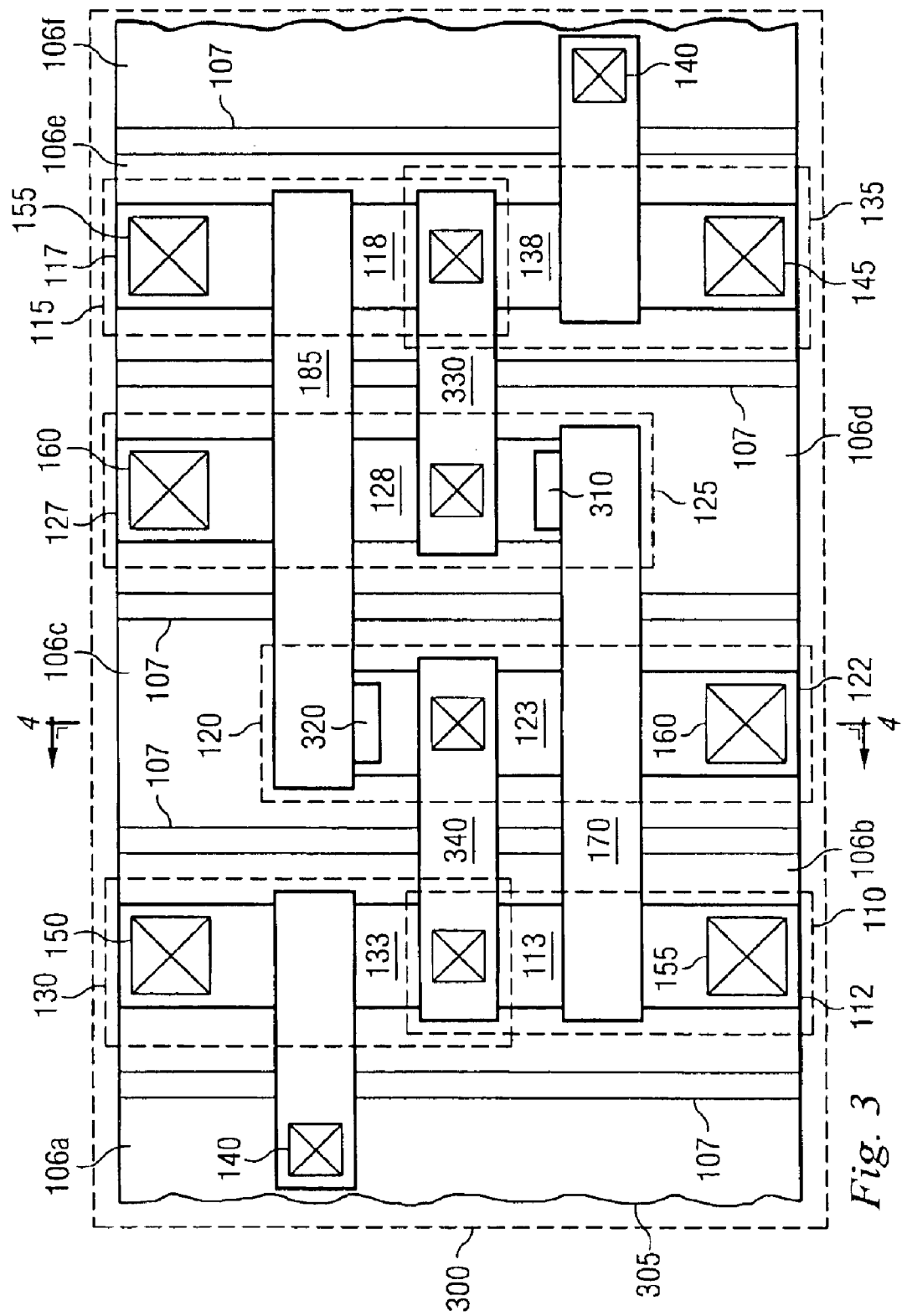
FIG. 3 illustrates a layout view of one embodiment of a memory cell constructed according to aspects of the present disclosure.

Referring to FIG. 3, illustrated is a layout view of one embodiment of a memory cell 300 constructed according to aspects of the present disclosure. In one embodiment, the memory cell 300 is an SRAM memory cell. Aspects of the memory cell 300 may be similar to those of the memory cell 100 shown in FIG. 1. However, the memory cell 300 does not include the connectors 180, 195 for coupling the first and second shared gates 170, 185 to the drains 128, 123 of the second and first pull-up transistors 125, 120, respectively, as shown in FIG. 1. In contrast, the memory cell 300 includes first and second conductive sills 310, 320. The first conductive sill 310 is formed on or in the drain 128 of the second pull-up transistor 125 and couples the drain 128 and the first shared gate 170. The second conductive sill 320 is formed on or in the drain 123 of the first pull-up transistor 120 and couples the drain 123 and the second shared gate 185. By employing the first and second conductive sills 310, 320, the connectors 180, 195 shown in FIGS. 1 and 2 are not required. Consequently, the number of layers required to fabricate the memory cell 300 of FIG. 3 may be fewer than the number of layers required to fabricate the memory cell 100 shown in FIGS. 1 and 2. Moreover, the reduction in the number of layers may be achieved without employing butted contacts, such that current leakage values are not sacrificed by the reduction in the number of layers employed to fabricate the memory cell 300.

Figure 4:
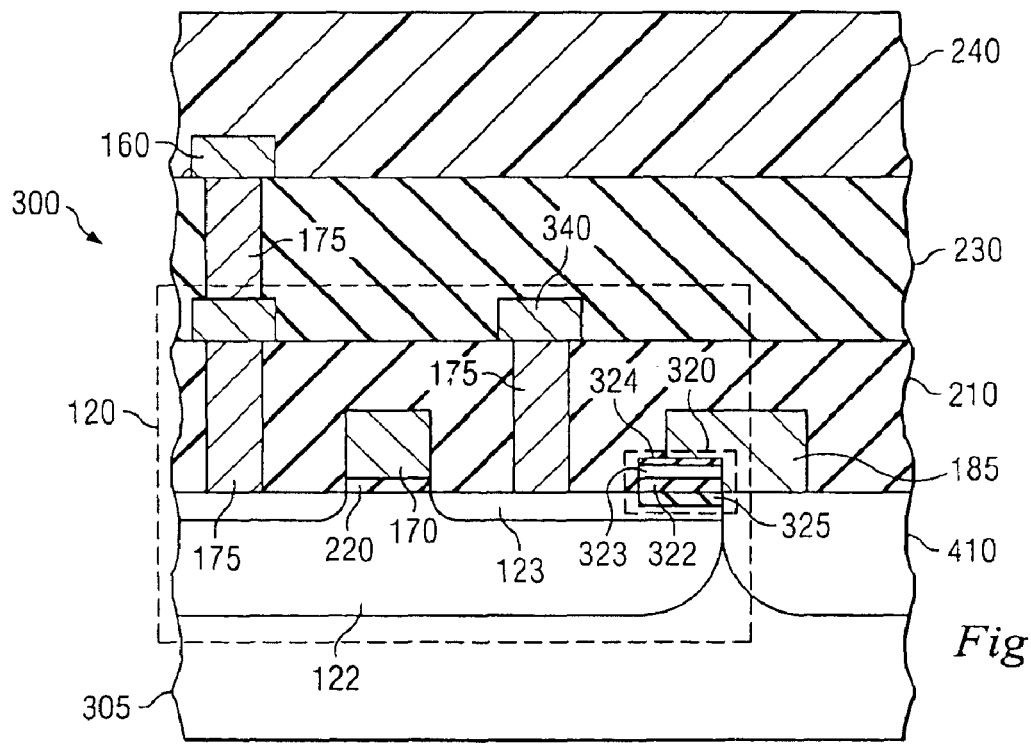
FIG. 4 illustrates a sectional view of the memory cell shown in FIG. 3.

Referring to FIG. 4, illustrated is a sectional view of the memory cell 300 shown in FIG. 3 in a subsequent stage of manufacture. In one embodiment, the conductive sill 320 is formed by first defining an oxide region 322 over, on or from the substrate 305. The substrate 305 may be a silicon-on-insulator (SOI) substrate, such as a silicon-on-sapphire substrate, a silicon germanium-on-insulator substrate, a diamond substrate, or another substrate comprising an epitaxial semiconductor layer on an insulator layer. The oxide region 322 may be defined by and/or during the same steps performed to define the gate oxide 220 shown in FIG. 2. The oxide region 322 may have a thickness ranging between about 5 Angstroms and about 30 Angstroms.

A polysilicon layer 323 may then be formed over the oxide region 322, possibly by selective deposition or by blanket deposition followed by patterning. However, in some embodiments the polysilicon layer 323 may not be formed. The polysilicon layer 323 may also undergo a silicide process to form a silicide layer 324 on the polysilicon 323. For example, the silicide 324 may comprise $TiSi_2$, $CoSi_2$, $NiSi_2$, $WSi_2$ or other materials that may be suitable for a silicided gate interconnect. Not all embodiments will include the silicide layer 324.

The conductive sills 310, 320 may undergo an ion implantation process, perhaps at an energy ranging between about 30 keV and about 400 keV with an impurity concentration ranging between about $1 \times 10^{15}$ atoms/$cm^2$ and about $1 \times 10^{17}$ atoms/$cm^2$. The ion implant process may implant ions such that a higher concentration is located within the oxide region 322 relative to neighboring components. The ion implant process may also implants ions in a region of the substrate 305 underlying the oxide region 322, thereby forming an active region 325 in the substrate 305. The ion implant process may be performed before or after the polysilicon layer 323 and the silicide layer 324 are formed.

The conductive sill 310 shown in FIG. 3 may be formed similarly to the formation of the conductive sill 320. Additional and/or alternative processes may also be employed to form the conductive sills 310, 320. Generally, the resistance of the conductive sills 310, 320 may range between about 1 kΩ and about 100 kΩ.

The process of forming the conductive sills 310, 320 may be easily implemented into existing fabrication procedures.

For example, the oxide region 322 may be formed simultaneously with the formation of the gate oxides of the transistors (110, 115, 120, 125, 130, 135), the polysilicon 323 deposition and the ion implant process (to form the active region 325) may be formed at any point in existing fabrication processes between the formation of the gate oxides 220 and the overlying dielectric layer 210, and the process forming the silicide layer 324 may be performed simultaneously with an existing silicide process employed to silicide portions of the transistors to form low-resistance contacts. Consequently, a process flow incorporating the conductive sills 310, 320 may be designed such that the thermal budget of processes and materials may be considered.

The particular dopants employed to form the conductive sills 310, 320 may depend on the particular layout of the application employing them. For example, if the conductive sills 310, 320 are formed over and/or adjacent an NMOS transistor, the dopant may be an n-type dopant, such as arsenic, P32, stibium and/or other n-type dopants. In contrast, if the conductive sills 310, 320 are formed over and/or adjacent a PMOS transistor, the dopant may be a p-type dopant, such as $BF_2$, indium and other p-type dopants. Of course, the scope of the present disclosure does not require that both of the conductive sills 310, 320 be implanted with the same dopant type.

The conductive sills 310, 320 may also provide greater SER immunity because they are located deeper within the memory cell 300 and, thus, further away from the packaging material 240 and better shielded from radiation originating from the packaging material 240 and surrounding environment. Moreover, the resistance along a conductive path between a drain and a shared gate to which the drain is coupled may be reduced relative to conventional designs. For example, the conductive sill 310 may be the only feature comprising the electrical path between the drain 128 of the second pull-up transistor 125 and the shared gate 170. In contrast, the electrical path between the drain 128 and the shared gate 170 in the embodiment shown in FIG. 1 includes (starting from the drain 128) a via 175, the connector 180 and another via 175. Accordingly, employing the conductive sills 310, 320 may reduce the number of elements, and electrical transitions between those elements, required to couple a drain and a shared gate, thereby reducing the resistance between the drain and shared gate.

The memory cell 300 may also include first and second connectors 330, 340. However, the first and second connectors 330, 340 may be formed from the same layer as the shared gates 170, 185, such that additional layers may not be required to form the connectors 330, 340. In the embodiment illustrated in FIGS. 3 and 4, the first connector 330 couples the drain 128 of the second pull-up transistor 125, the source 118 of the second pull-down transistor 115 and the source 138 of the second pass-gate transistor 135. Similarly, the second connector 340 couples the drain 123 of the first pull-up transistor 120, the source 113 of the first pull-down transistor 110 and the source 133 of the first pass-gate transistor 130.

FIG. 4 also illustrates that the memory cell 300 may include additional isolation structures 410. The isolation structures 410 may be similar in composition and manufacture to the isolation structures 107 shown in FIGS. 1 and 3. For example, the isolation structures 410 may be shallow trench isolation structures, wherein a shallow trench may be etched or otherwise formed in the substrate 305 and subsequently filled with silicon dioxide or another dielectric material. In general, the isolation structures 410 may be formed to provided additional electrical isolation between neighboring transistors and other components. As such, one or more of the isolation structures 410 may be formed in a somewhat random pattern as needed to provide additional electrical isolation in certain areas.

Figure 5:
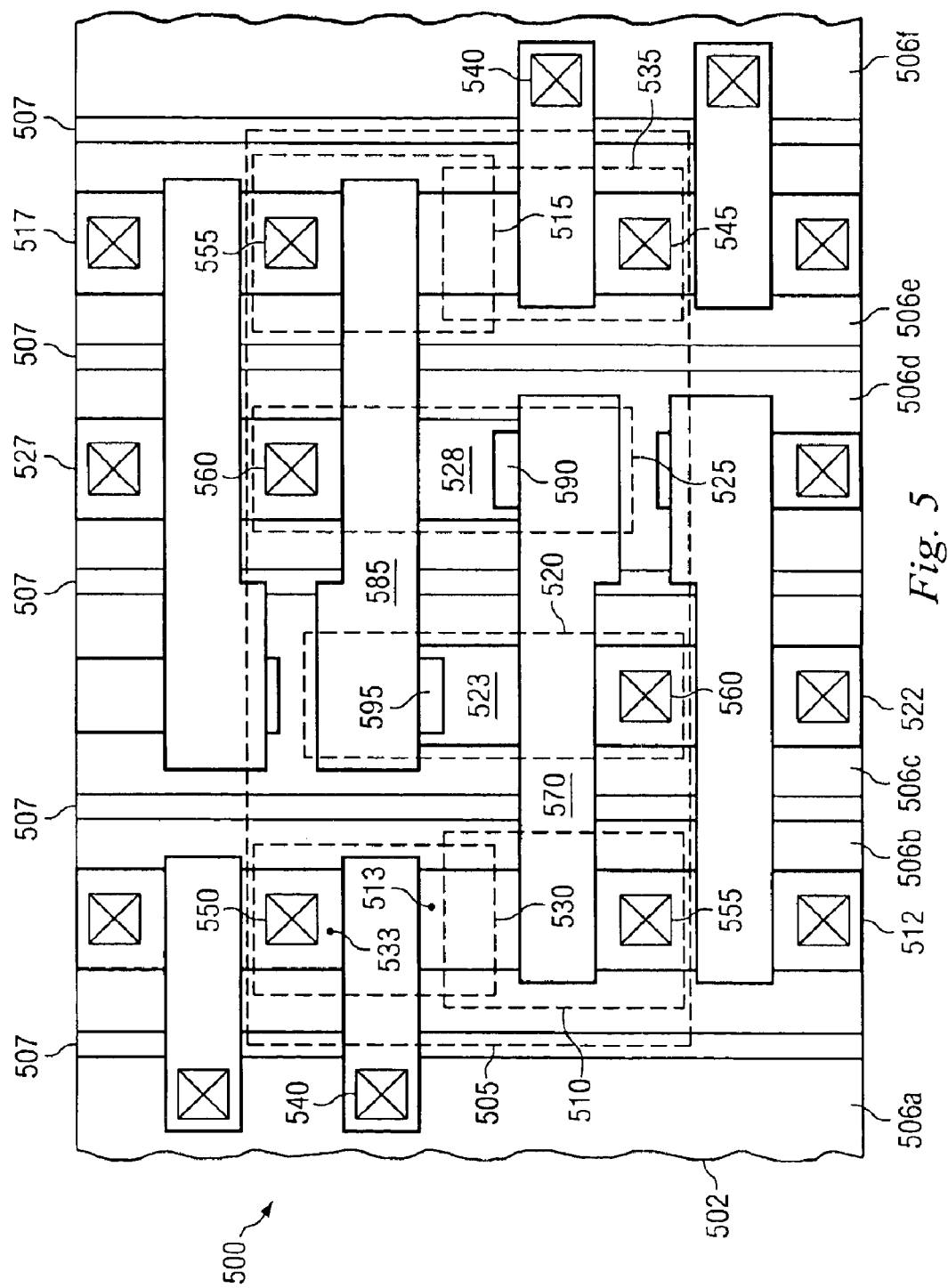
FIG. 5 illustrates a layout view of another embodiment of a memory cell constructed according to aspects of the present disclosure.

Those skilled in the art will recognize that aspects of the present disclosure are not limited to the memory cell 300 application shown in FIG. 3. For example, a conductive sill formed according to aspects of the present disclosure may be employed to interconnect myriad numbers and types of features incorporated in integrated circuits and other microelectronic devices. Referring to FIG. 5, illustrated is a layout view of another embodiment of an integrated circuit forming a memory array 500 constructed according to aspects of the present disclosure. The memory array 500 includes several memory cells 505, one of which is indicated by dashed lines in FIG. 5.

The memory cell 505 is formed over a substrate 502 having regions 506a–f defined by isolation structures 507. The memory cell 505 includes first and second pull-down transistors 510, 515, first and second pull-up transistors 520, 525 and first and second pass-gate transistors 530, 535. The memory cell 505 also includes word-line contacts 540, a bit-line contact 545, a bit-bar-line contact 550, $V_{ss}$ contacts 555 and $V_{cc}$ contacts 560.

The memory cell 505 also includes first and second shared gates 570, 585. The first shared gate 570 spans a p-type doped well 512 of the first pull-down transistor 510 and an n-type doped well 522 of the first pull-up transistor 520 and extends over an isolation structure 507 into the transistor region 506d. The second shared gate 585 spans a p-type doped well 517 of the second pull-down transistor 515 and an n-type doped well 527 of the second pull-up transistor 525 and extends over an isolation structure 507 into the transistor region 506c.

The memory cell 505 also includes first and second conductive sills 590, 595, which may be substantially similar in composition and manufacture to the conductive sills 310, 320 shown in FIGS. 3 and 4. The first conductive sill 590 couples the shared gate 570 and the drain 528 of the second pull-up transistor 525. The second conductive sill 595 couples the shared gate 585 and the drain 523 of the first pull-up transistor 520.

Although embodiments of the present disclosure have been described in detail, those skilled in the art should understand that they can make various changes, substitutions and alteration herein without departing from the spirit and scope of the present disclosure.

What is claimed is:

1. A memory cell, comprising:
   a plurality of transistors each including:
      source/drain regions located in a substrate; and
      a gate electrode located over the substrate between associated source/drain regions; and
   at least one conductive sill contacting a source/drain region of a first one of the plurality of transistors and a gate electrode of a second one of the plurality of transistors.

2. The memory cell of claim 1 wherein each of the plurality of transistors comprises a gate oxide interposing the gate electrode and the substrate and the at least one conductive sill is substantially coplanar with the gate oxides.

3. The memory cell of claim 2 wherein the conductive sill and the gate oxides comprise substantially similar compositions before doping.

4. The memory cell of claim 1 wherein the conductive sill has an implant concentration ranging between about $1\times10^{15}$ atoms/cm$^2$ and about $1\times10^{17}$ atoms/cm$^2$.

5. The memory of claim 1 wherein the memory cell is an SRAM memory cell.

6. The memory cell of claim 1 wherein the conductive sill is doped with an impurity material selected from the group consisting of:
   phosphorous;
   arsenic;
   P31; and
   stibium.

7. The memory cell of claim 1 wherein the conductive sill is doped with an impurity material selected from the group consisting of:
   boron;
   $BF_2$; and
   indium.

8. The memory cell of claim 1 wherein the conductive sill is an epitaxial layer.

9. The memory cell of claim 1 wherein the conductive sill comprises an oxide layer and a polysilicon layer located over the oxide layer.

10. The memory cell of claim 9 wherein the doped oxide comprises a silicide layer located over the polysilicon layer.

11. The memory cell of claim 9 wherein the conductive sill comprises an active region in the substrate and below the oxide layer.

12. An integrated circuit, comprising:
   a substrate having first and second regions opposing an isolation structure, the first and second regions including respective first and second doped wells;
   a first transistor having a gate electrode spanning the isolation structure and extending at least partially over the first doped well and the second substrate region;
   a second transistor having a source/drain region in the second doped well; and
   a conductive sill contacting a portion of the source/drain region and interposing the gate electrode and a portion of the second region.

13. The integrated circuit of claim 12 wherein the conductive sill and the first and second transistors at least partially form a static-random-access memory (SRAM).

14. The integrated circuit of claim 13 wherein the SRAM is a 6T-SRAM.

15. The integrated circuit of claim 12 wherein the substrate comprises diamond.

16. A method of manufacturing a memory device, comprising:
   forming a plurality of transistors over a substrate, including:
      forming a plurality of source/drain regions in the substrate; and
      forming a plurality of gate electrodes over the substrate and between associated ones of the plurality of source/drain regions; and
   forming at least one conductive sill coupling at least of one of the plurality of source/drain regions and at least one of the plurality of gate electrodes.

17. The method of claim 16 wherein forming at least one conductive sill includes implanting impurities at an implant energy ranging between 30 keV and about 400 keV.

18. The method of claim 16 wherein forming at least one conductive sill includes implanting impurities at a dosage ranging between about $1 \times 10^{15}$ atoms/cm$^2$ and about $1 \times 10^{17}$ atoms/cm$^2$.

19. The method of claim 16 wherein forming at least one conductive sill includes implanting an impurity material selected from the group consisting of:
   phosphorous;
   arsenic;
   P31; and
   stibium.

20. The method of claim 16 wherein forming at least one conductive sill includes implanting an impurity material selected from the group consisting of:
   boron;
   $BF_2$; and
   indium.

21. The method of claim 16 wherein forming the plurality of transistors includes forming a plurality of gate oxides by etching a deposited oxide layer and forming at least one conductive sill includes implanting a portion of the deposited oxide layer.

22. The method of claim 21 wherein forming at least one conductive sill includes forming a polysilicon layer over the implanted portion of the oxide layer.

23. The method of claim 22 wherein forming at least one conductive sill includes forming a silicide layer over the polysilicon layer.

24. The method of claim 21 wherein the implanting forms an active region in the substrate under the implanted portion of the oxide layer.

* * * * *